(12) United States Patent
Lee

(10) Patent No.: US 8,941,227 B2
(45) Date of Patent: Jan. 27, 2015

(54) PACKAGE STRUCTURE AND METHOD FOR MANUFACTURING SAME

(71) Applicant: Zhen Ding Technology Co., Ltd., Tayuan, Taoyuan (TW)

(72) Inventor: Taekoo Lee, Qinhuangdao (CN)

(73) Assignee: Zhen Ding Technology Co., Ltd., Tayuan, Taoyuan (TW)

( * ) Notice: Subject to any disclaimer, the term of this patent is extended or adjusted under 35 U.S.C. 154(b) by 0 days.

(21) Appl. No.: 14/101,352

(22) Filed: Dec. 10, 2013

(65) Prior Publication Data

US 2014/0175646 A1    Jun. 26, 2014

(30) Foreign Application Priority Data

Dec. 21, 2012    (CN) .......................... 2012 1 5611587

(51) Int. Cl.
*H01L 23/492*    (2006.01)
*H01L 23/498*    (2006.01)
*H01L 25/065*    (2006.01)
*H01L 25/00*    (2006.01)
*H01L 23/31*    (2006.01)
*H01L 23/00*    (2006.01)

(52) U.S. Cl.
CPC ...... *H01L 23/49816* (2013.01); *H01L 25/0657* (2013.01); *H01L 25/50* (2013.01); *H01L 2224/92242* (2013.01); *H01L 23/3128* (2013.01); *H01L 24/13* (2013.01); *H01L 24/16* (2013.01); *H01L 24/32* (2013.01); *H01L 24/73* (2013.01); *H01L 24/92* (2013.01); *H01L 2224/131* (2013.01); *H01L 2224/13147* (2013.01); *H01L 2224/16225* (2013.01); *H01L 2224/32145* (2013.01); *H01L 2224/32225* (2013.01); *H01L 2224/73253* (2013.01); *H01L 2224/92225* (2013.01); *H01L 2225/06517* (2013.01); *H01L 2924/15311* (2013.01); *H01L 2924/19107* (2013.01); *H01L 2225/06558* (2013.01)
USPC ............ 257/686; 257/700; 257/777; 438/109

(58) Field of Classification Search
CPC ................. H01L 25/0657; H01L 2225/06548; H01L 24/33; H01L 24/83
USPC .......................... 257/686, 700, 777; 438/109
See application file for complete search history.

(56) References Cited

U.S. PATENT DOCUMENTS 6,590,282 B1 * 7/2003 Wang et al. ................... 257/686
6,960,827 B2 * 11/2005 Nishimura et al. ........... 257/723

(Continued)

*Primary Examiner* — George Fourson, III
(74) *Attorney, Agent, or Firm* — Novak Druce Connolly Bove + Quigg LLP

(57) ABSTRACT

An exemplary package substrate includes a package substrate, a first connection substrate, a first chip, a dielectric adhesive sheet, a second chip, and a second connection substrate. The package substrate includes many first and second electrical contact pads. The first connection substrate includes many third and fourth electrical contact pads. Each fourth electrical contact pad is electrically connected to one first electrical contact pad. The first chip includes many first electrode pads. Each first electrode pad is electrically connected to the corresponding third electrical contact pad. The second chip is connected to the first chip by the dielectric adhesive sheet, and includes many second electrode pads. The second connection substrate includes many fifth and sixth electrical contact pads. Each fifth electrical contact pad is electrically connected to one second electrode pad, and each sixth electrical contact pad is electrically connected to one second electrical contact pad.

16 Claims, 9 Drawing Sheets

(56) References Cited

U.S. PATENT DOCUMENTS

| | | | |
|---|---|---|---|
| 7,176,506 B2 * | 2/2007 | Beroz et al. | 257/232 |
| 8,516,690 B2 * | 8/2013 | Hatanaka et al. | 29/830 |
| 2005/0173807 A1 * | 8/2005 | Zhu et al. | 257/777 |
| 2007/0132081 A1 * | 6/2007 | Wang et al. | 257/686 |
| 2008/0237832 A1 * | 10/2008 | Hsu et al. | 257/691 |
| 2008/0237833 A1 * | 10/2008 | Hsu et al. | 257/691 |
| 2013/0329374 A1 * | 12/2013 | Lin et al. | 361/728 |

* cited by examiner

PACKAGE STRUCTURE AND METHOD FOR MANUFACTURING SAME

BACKGROUND

1. Technical Field

The present disclosure generally relates to semiconductor package technology, and particularly to a package structure and a method for manufacturing the package structure.

2. Description of Related Art

A typical package structure includes an upper package device, a lower package device, and a number of solder balls sandwiched between the upper package and the lower package device for electrically connecting the upper package device and the lower package device. However, because of the height of the conventional solder ball being between 200 micrometers and 300 micrometers, the height of the package structure is undesirable. In addition, the temperature of the conventional package structure rises during thermal cycling testing or actual operation, thus thermal stress increases conduction in the package structure due to the differences of coefficient of thermal expansion (CTE) in different materials in the package structure. Easily inducing warpage of the lower package device and the upper package device caused by poor joints such as missing solder or cold solder or breaking of solder balls leading to poor reliability of the package structure.

What is needed, therefore, is a package structure and a method for manufacturing the package structure to overcome the above-described problems.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, all the views are schematic, and like reference numerals designate corresponding parts throughout the several views.

DETAILED DESCRIPTION

A package structure and a method for manufacturing a package structure and a according to embodiments will be described with reference to the drawings.

Figure 1:
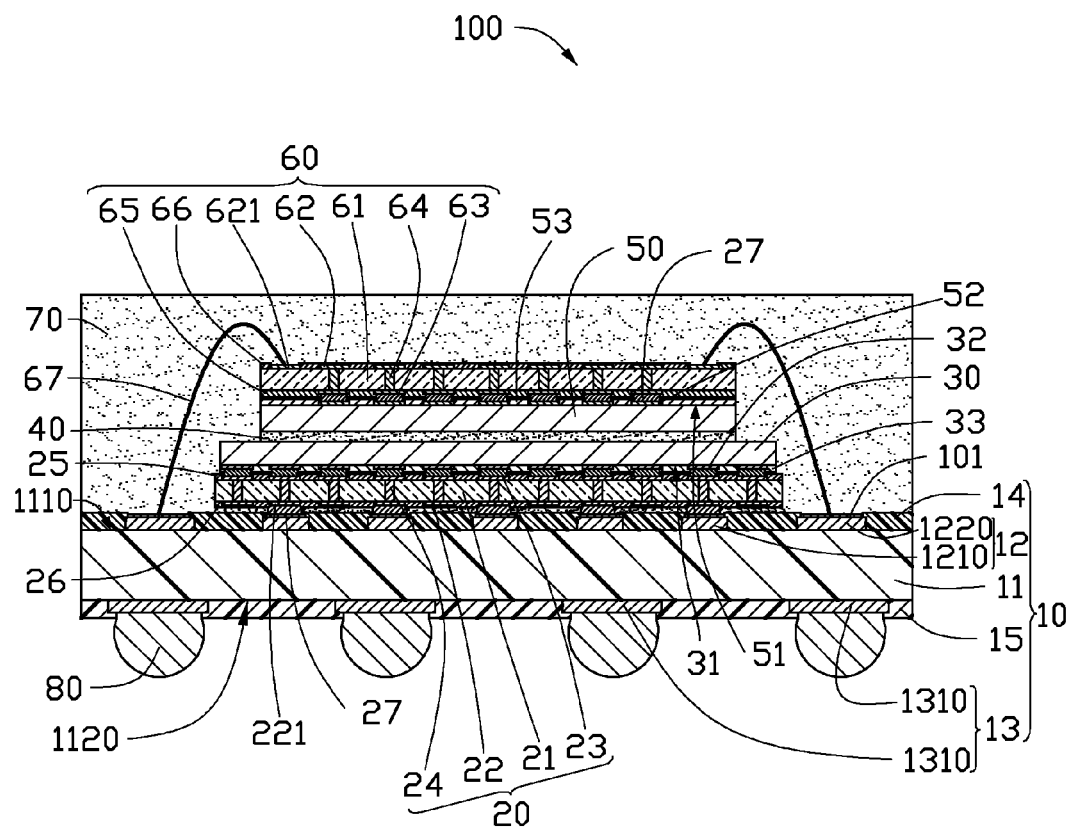
FIG. 1 shows a package structure according to an exemplary embodiment.

FIG. 1 shows a package structure 100 according to a first illustrated embodiment. The package structure 100 includes a package substrate 10, a first connection substrate 20, a first chip 30, a dielectric adhesive sheet 40, a second chip 50, a second connection substrate 60, a package adhesive body 70, and solder balls 80. The package substrate 10, the first connection substrate 20, the first chip 30, the dielectric adhesive sheet 40, the second chip 50, the second connection substrate 60 are arranged in a described order.

The package substrate 10 includes a first base 11, a first wiring layer 12, a second wiring layer 13, a first solder mask 14 formed on the first wiring layer 12, and a second solder mask 15 formed on the second wiring layer 13. The first base 11 is sandwiched between the first wiring layer 12 and the second wiring layer 13.

The first base 11 is a multilayer structure, and includes a plurality of resin layers and a plurality of wiring layers (not shown), which are alternatively arranged. The first base 11 includes a first surface 1110 and a second surface 1120 facing away from the first surface 1110. The first wiring layer 12 is formed on the first surface 1110. The second wiring layer 13 is formed on the second surface 1120. The wiring layers of the first base 11 are electrically connected to each other by conductive vias (not shown) in the first base 11. The wiring layers of the first base 11, the first wiring layer 12, and the second wiring layer 13 are electrically connected to each other by conductive vias in the first base 11.

The first solder mask 14 covers a portion of the first wiring layer 12, and portions of the first wiring layer 12 are exposed from the first solder mask 14 to define a plurality of first electrical contact pads 1210, and a plurality of second electrical contact pads 1220. The first electrical contact pads 1210 are arranged in an array. The second electrical contact pads 1220 surrounds the first electrically contact pads 1210.

The second solder mask 15 covers a portion of the second wiring layer 13, and portions of the second wiring layer 13 are exposed from the second solder mask 15 to define a plurality of seventh electrical contact pads 1310. The seventh electrical contact pads 1310 are arranged in an array. The first electrical contact pads 1210 and the second electrical contact pads 1220 are electrically connected to the seventh electrical contact pads 1310 by wires of the first wiring layer 12 and the second wiring layer 13, and wiring layers and conductive vias of the first base 111.

There may be a organic protection layer or a micro solder ball on each of the first electrical contact pads 1210, the second electrical contact pads 1220, and the seventh electrical contact pads 1310. Allowing for easy electrically connection to the first electrical contact pads 1210, the second electrical contact pads 1220, and the seventh electrical contact pads 1330. In the present embodiment, there is an organic protection layer 101 on each of the first electrical contact pads 1210, the second electrical contact pads 1220, and the seventh electrical contact pads 1330.

The first connection substrate 20 is packaged on a side of the first wiring layer 12 of the package substrate 10. In the present embodiment, the first connection substrate 20 is a glass circuit substrate. The first connection substrate 20 includes a second base 21, a third wiring layer 22, and a plurality of third electrical contact pads 23. The second base 21 is a glass base. A plurality of first conductive vias 24 is formed in the second base 21. Each third electrical contact pad 23 is electrically connected to the third wiring layer 22 by one first conductive via 24. The third wiring layer 22 includes a plurality of wires and a plurality of fourth electrical contact pads 221 electrically connected to the wires of the third wiring layer 22. Each fourth electrical contact pad 221 spatially corresponds to a first electrical contact pad 1210.

The first connection substrate 20 also includes a third solder mask 25 and a fourth solder mask 26. The third solder mask 25 and the fourth solder mask 26 are respectively formed at two opposite surfaces of the second base 21. A plurality of openings is formed in the third solder mask 25. Each third electrical contact pad 23 is exposed to the outside from one opening of the third solder mask 25. A plurality of openings is formed in the fourth solder mask 26. Each fourth electrical contact pad 221 is exposed to the outside from one opening of the fourth solder mask 26.

In the present embodiment, a micro solder ball 27 is formed on each of the third electrical contact pads 23 and the fourth electrical contact pads 221. The micro solder ball 27 protrudes out of the third solder mask 25 or the fourth solder mask 26. Each fourth electrical contact pad 221 is electrically connected to one first electrical contact pad 1210 of the package substrate 10 by the micro solder ball 27 on the corresponding fourth electrical contact pad 221.

Figure 2:
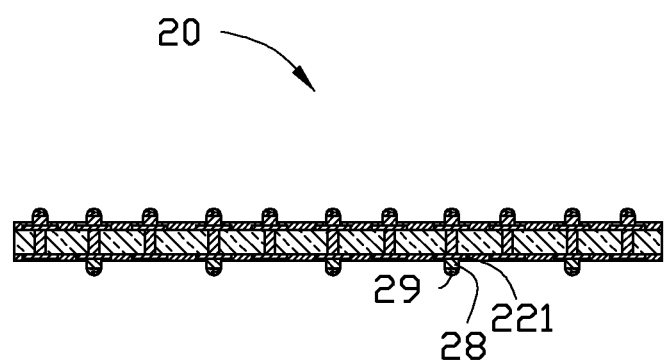
FIG. 2 shows a first connection substrate according to the exemplary embodiment.

There may be a copper post 28 formed on each of the first electrical contact pads 1210, the second electrical contact pads 1220. In addition, the seventh electrical contact pads 1330 (see FIG. 2), and a solder cap 29 is formed on an end of the copper post 28 further away from the third electrical contact pad 23 or the fourth electrical contact pad 221.

The first chip 30 is a logic chip. The first chip 30 is packaged on the first connection substrate 20. The first chip 30 has a first package surface 31. A plurality of first electrode pads 32 are formed on the first package surface 31. Each first electrode pad 32 spatially corresponds to one third electrical contact pad 23. In the present embodiment, a fifth solder mask 33 is formed on the first package surface 31. A number of openings are formed in the fifth solder mask 33. Each first electrode pad 32 is exposed to the outside from one opening of the fifth solder mask 33. There may be a nickel plating layer on a surface of each first electrode pad 32 to protect the first electrode pad 32. In the present embodiment, each first electrode pad 32 is electrically connected to a third electrical contact pad 23 by a micro solder ball 27 or a copper post 28 on the third electrical contact pad 23.

The dielectric adhesive sheet 40 is adhered to a surface of the first chip 30 further away from the first connection substrate 20. The dielectric adhesive sheet 40 is adhered between the first chip 30 and the second chip 50, adhering and electrically insulating the first chip from the second chip 50. The dielectric adhesive sheet 40 may be an insulating adhesive sheet.

The second chip 50 is a memory chip. The second chip 50 is adhered to the dielectric adhesive sheet 40. The second chip 50 has a second package surface 51. The second package surface 51 is away from the dielectric adhesive sheet 40. A plurality of second electrode pads 52 is formed on the second package surface 51. In the present embodiment, a sixth solder mask 53 is formed on the second package surface 53. A plurality of openings is formed in the sixth solder mask 53. Each second electrode pad 52 is exposed from one opening of the sixth solder mask 53. There may be a nickel plating layer on a surface of each second electrode pad 52 to protect the second electrode pad 52.

The second connection substrate 60 is packaged on the second chip 50. In the present embodiment, the second connection substrate 60 is a glass circuit substrate. The second connection substrate 60 includes a third base 61, a fourth wiring layer 62, and a plurality of fifth electrical contact pads 63. The third base 61 is a glass base. A plurality of second conductive vias 64 is formed in the third base 61. Each fifth electrical contact pad 63 is electrically connected to the fourth wiring layer 62 by one second conductive via 64. The fourth wiring layer 62 includes a plurality of wires and a plurality of sixth electrical contact pads 621 electrically connected to the wires of the fourth wiring layer 62. Each sixth electrical contact pad 621 spatially corresponds to a second electrical contact pad 1210. In the present embodiment, the sixth electrical contact pads 621 are close to an edge of the second connection substrate 60.

The second connection substrate 60 also includes a seventh solder mask 65 and a eighth solder mask 66. The seventh solder mask 65 and the eighth solder mask 66 are respectively formed at two opposite surfaces of the third base 61. A plurality of openings is formed in the seventh solder mask 65. Each fifth electrical contact pad 63 is exposed to the outside from one opening of the seventh solder mask 65. A plurality of openings is formed in the eighth solder mask 66. Each sixth electrical contact pad 621 is exposed to the outside from one opening of the eighth solder mask 66.

In the present embodiment, a micro solder ball 27 is formed on each of the fifth electrical contact pads 63 and the sixth electrical contact pads 621. The micro solder ball 27 protrudes out of the seventh solder mask 65 or the eighth solder mask 66. Each fifth electrical contact pad 63 is electrically connected to one second electrode pad 52 of the second chip 50 by the micro solder ball 27 on the corresponding fifth electrical contact pad 52.

There may be a copper post 28 formed on each of the fifth electrical contact pads 63, and a solder cap 29 is formed on an end of the copper post 28 further away from the fifth electrical contact pad 63.

Each sixth electrical contact pad 621 is electrically connected to one second electrical contact pad 1220 by a bonding wire 67, such that the second connection substrate 60 is electrically connected to the package substrate 10.

In the present embodiment, a cross-sectional area of the package substrate 10 is larger than a cross-sectional area of the first connection substrate 20. The cross-sectional area of the first connection substrate 20 is larger than a cross-sectional area of each of the first chip 30, the dielectric adhesive sheet 40, the second chip 50, and the second connection substrate 60. In the present embodiment, the package adhesive body 70 is formed at a side of the package substrate 10, and covers the first connection substrate 20, the first chip 30, the dielectric adhesive sheet 40, the second chip 50, and the second connection substrate 60. In addition, a portion of the package adhesive body 70 is also in a gap between the package substrate 10 and the first connection substrate 20, a gap between the first connection substrate 20 and the first chip 30, and a gap between the second connection substrate 60 and the second chip 50.

Each solder ball 80 is formed at a surface of each seventh electrical contact pad 1310. The solder balls 80 electrically connect the package structure 100 with other electronic component.

A method of manufacturing a package structure 100 according to a second embodiment includes the steps as follows.

In step 1, the package substrate 10, the first connection substrate 20, the first chip 30, the dielectric adhesive sheet 40, the second chip 50, and the second connection substrate 50 are provided.

Figure 3:
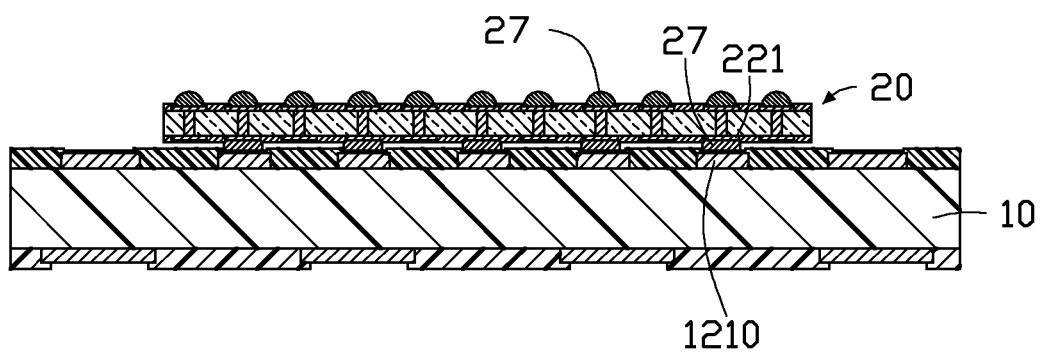
FIG. 3 shows the first connection substrate of FIG. 2 arranged on a package substrate.

FIG. 3 shows step 2, in which the first connection substrate 20 is arranged on the package substrate 10.

In detail, each fourth electrical contact pad 221 is electrically connected to the corresponding first electrical contact pad 1210. In the present embodiment, each fourth electrical contact pad 221 is electrically connected to the corresponding first electrical contact pad 1210 by the micro solder ball 27 on the fourth electrical contact pad 221.

Figure 4:
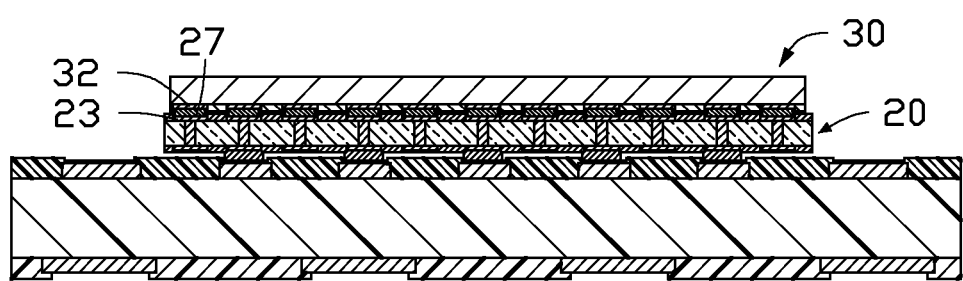
FIG. 4 shows a first chip arranged on the first connection substrate of FIG. 3.

FIG. 4 shows step 3, in which the first chip 30 is arranged on the first connection substrate 20.

In detail, each first electrode pad 32 is electrically connected to the corresponding third electrical contact pad 23. In the present embodiment, each first electrode pad 32 is electrically connected to the corresponding third electrical contact pad 23 by the micro solder ball 27 on the third electrical contact pad 23.

Figure 5:
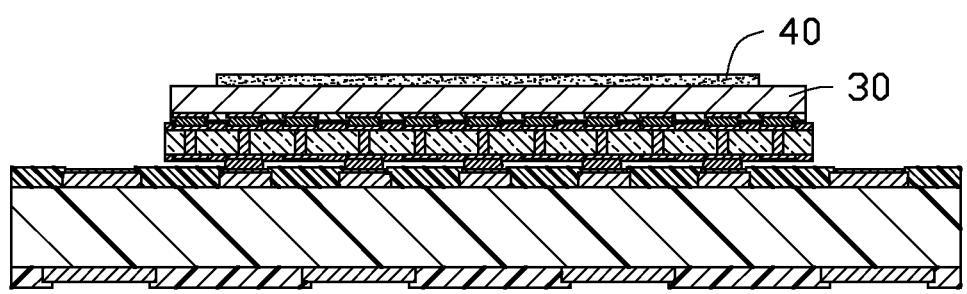
FIG. 5 shows a first dielectric adhesive sheet adhered on the first chip of FIG. 4.

FIG. 5 shows step 4, in which the dielectric adhesive sheet 40 is arranged on the surface of the first chip 30 further away from the first connection substrate 20.

Figure 6:
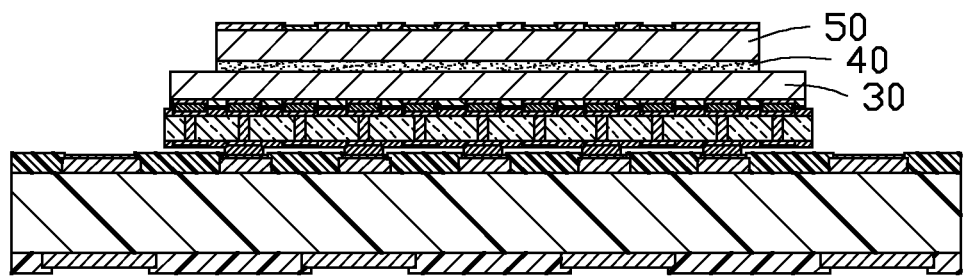
FIG. 6 shows a second chip arranged on the first dielectric adhesive sheet of FIG. 5.

FIG. 6 shows step 5, in which the second chip 50 is arranged on a side of the dielectric adhesive sheet 40 further away from the first chip 30.

Figure 7:
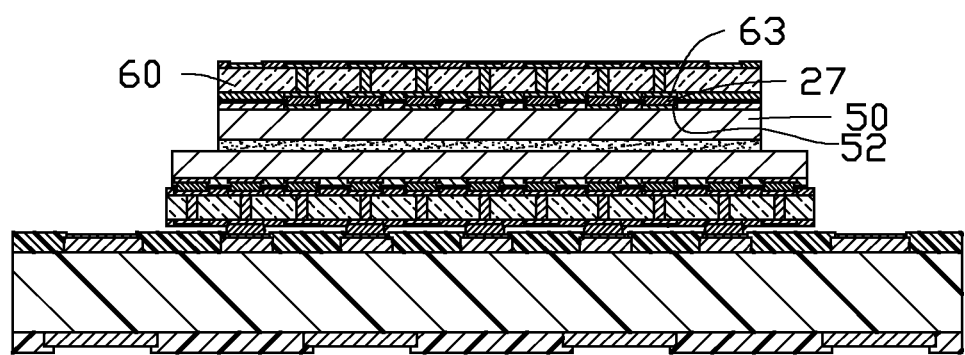
FIG. 7 shows a second connection substrate arranged on the second chip of FIG. 6.

FIG. 7 shows step 6, in which the second connection substrate 60 is arranged on the second chip 50. In this step, each fifth electrical contact pad 63 is electrically connected to the corresponding second electrode pad 52. In detail, each fifth electrical contact pad 63 is electrically connected to the corresponding second electrode pad 52 by the micro solder ball 27 on the fifth electrical contact pad 63.

Figure 8:
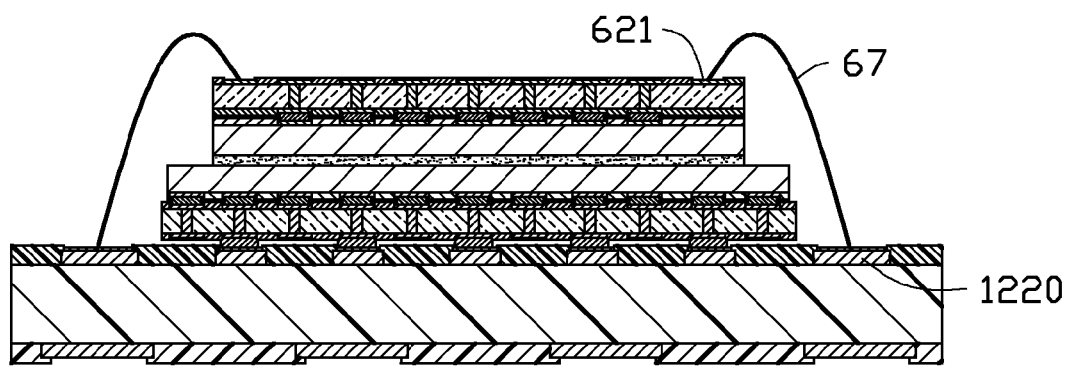
FIG. 8 shows bonding wires formed between the second connection substrate and the package substrate of FIG. 7.

FIG. 8 shows step 7, in which the second connection substrate 60 is electrically connected to the package substrate 10. In the present embodiment, each sixth electrical contact pad 621 is electrically connected to the corresponding second electrical contact pad 1220 by the bonding wire 67, such that the second connection substrate 60 is electrically connected to the package substrate 10.

Figure 9:
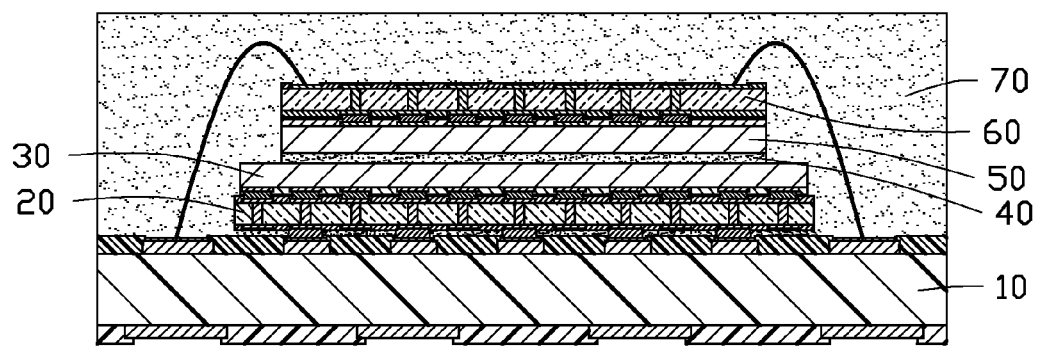
FIG. 9 shows a package adhesive body formed at a side of the package substrate of FIG. 8 to cover the first connection substrate, the first chip, the dielectric adhesive sheet, the second chip, and the second connection substrate.

FIG. 9 shows step 8, in which the package adhesive body 70 is formed on the package substrate 10, such that the package adhesive body 70 covers the first connection substrate 20, the first chip 30, the dielectric adhesive sheet 40, the second chip 50, and the second connection substrate 60. In addition, a portion of the package adhesive body 70 is also in a gap between the package substrate 10 and the first connection substrate 20, a gap between the first connection substrate 20 and the first chip 30, and a gap between the second connection substrate 60 and the second chip 50.

FIG. 1 shows step 9, in which the solder ball 80 is formed on each seventh electrical contact pad 1310.

It is understood that solder ball 80 may or may not be used in the package structure 100.

It is understood that in the method for manufacturing the package structure, there may be a copper post formed on each of the third electrical contact pads 23, the fourth electrical contact pads 221, and the fifth electrical contact pads 63. A solder cap is formed on an end of the copper post further away from the corresponding electrical contact pad. In such case, each fourth electrical contact pad 221 is electrically connected to the first electrical contact pad 1210 by the copper post and the solder cap on the corresponding fourth electrical contact pad 221. Each third electrical contact pad 23 is electrically connected to the first electrode pad 32 by the copper post and the solder cap on the corresponding third electrical contact pad 23. Each fifth electrical contact pad 63 is electrically connected to the second electrode pad 52 by the copper post and the solder cap on the corresponding fifth electrical contact pad 63.

A method of manufacturing a package structure 100 according to a third embodiment is similar to the method of manufacturing a package structure 100 according to the second embodiment, and the method of manufacturing a package structure 100 according to the third embodiment includes the steps as follows.

In step 1, the package substrate 10, the first connection substrate 20, the first chip 30, the dielectric adhesive sheet 40, the second chip 50, and the second connection substrate 50 are provided.

In step 2, the first chip 30 is arranged on the first connection substrate 20.

In detail, each first electrode pad 32 is electrically connected to the corresponding third electrical contact pad 23. In the present embodiment, each first electrode pad 32 is electrically connected to the corresponding third electrical contact pad 23 by the micro solder ball 27 on the third electrical contact pad 23.

In step 3, the first connection substrate 20 with the first chip 30 is arranged on the package substrate 10. In detail, each fourth electrical contact pad 221 is electrically connected to the corresponding first electrical contact pad 1210 by the micro solder ball 27 on the fourth electrical contact pad 221.

In step 4, the second chip 50 is arranged on the second connection substrate 60. In detail, each fifth electrical contact pad 63 is electrically connected to the corresponding second electrode pad 52. In detail, each fifth electrical contact pad 63 is electrically connected to the corresponding second electrode pad 52 by the micro solder ball 27 on the fifth electrical contact pad 63. [0019] In step 5, the dielectric adhesive sheet 40 is arranged on the surface of the first chip 30 further away from the first connection substrate 20.

In step 6, the second chip 50 is arranged on a side of the first chip 30 further away from the first connection substrate 20 by the dielectric adhesive sheet 40.

Step 7 and step 8 are identical with step 7 and step 8 in the second embodiment.

In the method of making the package structure 100, after the first connection substrate 20 is respectively connected to the first chip 30, the second connection substrate 60, and the second chip 50, the first connection substrate 20, which has the first chip 30, the second connection substrate 60, and the second chip 50 arranged thereon, is connected to the second connection substrate 10. The productivity of the package structure 100 is thus improved.

In the structure of the package structure 100, because one connection substrate is connected to one chip, and the connection substrate is electrically connected to the package substrate, there is no bigger solder balls to connect two package bodies. The volume of the package structure 100 is thus smaller, and reliability of the package structure 100 is improved.

While certain embodiments have been described and exemplified above, various other embodiments will be apparent from the foregoing disclosure to those skilled in the art. The disclosure is not limited to the particular embodiments described and exemplified but is capable of considerable variation and modification without departure from the scope and spirit of the appended claims.

What is claimed is:

1. A package structure comprising:
   a package substrate, the package substrate comprising a plurality of first electrical contact pads, and a plurality of second electrical contact pads;
   a first connection substrate, the first connection substrate comprising a plurality of third electrical contact pads, and a plurality of fourth electrical contact pads spatially corresponding to the first electrical contact pads, each fourth electrical contact pad being electrically connected to the corresponding first electrical contact pad;
   a first chip, the first chip comprising a plurality of first electrode pads spatially corresponding to the third electrical contact pads, each first electrode pad being electrically connected to the corresponding third electrical contact pad;

a dielectric adhesive sheet;

a second chip, the second chip being connected to the first chip by the dielectric adhesive sheet, the second chip comprising a plurality of second electrode pads, and a second connection substrate, the second connection substrate comprising a plurality of fifth electrical contact pads spatially corresponding to the second electrode pads, and a plurality of sixth electrical contact pads spatially corresponding to the second electrical contact pads, each fifth electrical contact pad being electrically connected to the corresponding second electrode pad, and each sixth electrical contact pad being electrically connected to the corresponding second electrical contact pad.

2. The package structure of claim 1, wherein the first connection substrate comprises a second base, and the second base is a glass base.

3. The package structure of claim 2, wherein the second connection substrate comprises a third base, and the third base is a glass base.

4. The package structure of claim 1, wherein a micro solder ball is formed on each of the third electrical contact pads, the fourth electrical contact pads, and fifth electrical contact pads, each fourth electrical contact pad is electrically connected to the corresponding first electrical contact pad by the micro solder ball on the corresponding fourth electrical contact pad, each third electrical contact pad is electrically connected to the corresponding first electrode pad by the micro solder ball on the corresponding third electrical contact pad, and each fifth electrical contact pad is electrically connected to the corresponding second electrode pad by the micro solder ball on the corresponding fifth electrical contact pad.

5. The package structure of claim 1, wherein a copper post is formed on each of the third electrical contact pads, the fourth electrical contact pads, and fifth electrical contact pads, and a solder cap is formed on an end of each copper post further away from the corresponding electrical contact pad, each fourth electrical contact pad is electrically connected to the corresponding first electrical contact pad by the copper post and the solder cap on the corresponding fourth electrical contact pad, each third electrical contact pad is electrically connected to the corresponding first electrode pad by the copper post and the solder cap on the corresponding third electrical contact pad, and each fifth electrical contact pad is electrically connected to the corresponding second electrode pad by the copper post and the solder cap on the corresponding fifth electrical contact pad.

6. The package structure of claim 1, wherein the sixth electrical contact pad is electrically connected to the corresponding second electrical contact pad by a bonding wire.

7. The package structure of claim 1, further comprising a package adhesive body, the package adhesive body formed at a side of the package substrate, and covering the first connection substrate, the first chip, the dielectric adhesive sheet, the second chip, and the second connection substrate.

8. The package structure of claim 1, wherein the first chip is a logic chip, and the second chip is a memory chip.

9. A method for manufacturing a package structure, comprising:

providing a package substrate, a first connection substrate, a first chip, a dielectric adhesive sheet, a second chip, and a second connection substrate, the first connection substrate comprising a plurality of third electrical contact pads, and a plurality of fourth electrical contact pads spatially corresponding to the first electrical contact pads, the first chip comprising a plurality of first electrode pads spatially corresponding to the third electrical contact pads, the second chip being connected to the first chip by the dielectric adhesive sheet, the second chip comprising a plurality of second electrode pads, and the second connection substrate comprising a plurality of fifth electrical contact pads spatially corresponding to the second electrode pads, and a plurality of sixth electrical contact pads spatially corresponding to the second electrical contact pads;

electrically connecting each fourth electrical contact pad to the corresponding first electrical contact pad, such that the first connection substrate is arranged on the package substrate;

electrically connecting each first electrode pad to the corresponding third electrical contact pad, such that the first chip is arranged on the first connection substrate;

arranging the dielectric adhesive sheet on a surface of the first chip further away from the first connection substrate;

arranging the second chip on a side of the dielectric adhesive sheet further away from the first chip;

electrically connecting each second electrode pad to the corresponding fifth electrical contact pad, such that the second connection substrate is arranged on the second chip, and electrically connecting each sixth electrical contact pad to the corresponding second electrical contact pad, such that the second connection substrate is electrically connected to the package substrate.

10. The method of claim 9, further comprising a step of forming a package adhesive body at a side of the package substrate, such that the package adhesive body covers the first connection substrate, the first chip, the dielectric adhesive sheet, the second chip, and the second connection substrate.

11. The method of claim 9, wherein a micro solder ball is formed on each of the third electrical contact pads, the fourth electrical contact pads, and the fifth electrical contact pads, each fourth electrical contact pad is electrically connected to the corresponding first electrical contact pad by the micro solder ball on the corresponding fourth electrical contact pad, each third electrical contact pad is electrically connected to the corresponding first electrode pad by the micro solder ball on the corresponding third electrical contact pad, and each fifth electrical contact pad is electrically connected to the corresponding second electrode pad by the micro solder ball on the corresponding fifth electrical contact pad.

12. The method of claim 9, wherein a copper post is formed on each of the third electrical contact pads, the fourth electrical contact pads, and fifth electrical contact pads, and a solder cap is formed on an end of each copper post further away from the corresponding electrical contact pad, each fourth electrical contact pad is electrically connected to the corresponding first electrical contact pad by the copper post and the solder cap on the corresponding fourth electrical contact pad, each third electrical contact pad is electrically connected to the corresponding first electrode pad by the copper post and the solder cap on the corresponding third electrical contact pad, and each fifth electrical contact pad is electrically connected to the corresponding second electrode pad by the copper post and the solder cap on the corresponding fifth electrical contact pad.

13. A method for manufacturing a package structure, comprising:

providing a package substrate, a first connection substrate, a first chip, a dielectric adhesive sheet, a second chip, and a second connection substrate, the first connection substrate comprising a plurality of third electrical contact pads, and a plurality of fourth electrical contact pads spatially corresponding to the first electrical contact pads, the first chip comprising a plurality of first electrode pads spatially corresponding to the third electrical contact pads, the second chip being connected to the first chip by the dielectric adhesive sheet, the second chip comprising a plurality of second electrode pads, and the second connection substrate comprising a plurality of fifth electrical contact pads spatially corresponding to the second electrode pads, and a plurality of sixth electrical contact pads spatially corresponding to the second electrical contact pads;

electrically connecting each first electrode pad to the corresponding third electrical contact pad, such that the first chip is arranged on the first connection substrate;

electrically connecting each fourth electrical contact pad to the corresponding first electrical contact pad, such that the first connection substrate with the first chip is arranged on the package substrate;

electrically connecting each fifth electrical contact pad to the corresponding second electrode pad, such that the second chip is arranged on the second connection substrate;

arranging the dielectric adhesive sheet on a surface of the first chip further away from the first connection substrate;

arranging the second chip on a side of the dielectric adhesive sheet further away from the first chip;

electrically connecting each sixth electrical contact pad to the corresponding second electrical contact pad, such that the second connection substrate is electrically connected to the package substrate.

14. The method of claim 13, further comprising a step of forming a package adhesive body at a side of the package substrate, such that the package adhesive body covers the first connection substrate, the first chip, the dielectric adhesive sheet, the second chip, and the second connection substrate.

15. The method of claim 13, wherein a micro solder ball is formed on each of the third electrical contact pads, the fourth electrical contact pads, and fifth electrical contact pads, each fourth electrical contact pad is electrically connected to the corresponding first electrical contact pad by the micro solder ball on the corresponding fourth electrical contact pad, each third electrical contact pad is electrically connected to the corresponding first electrode pad by the micro solder ball on the corresponding third electrical contact pad, and each fifth electrical contact pad is electrically connected to the corresponding second electrode pad by the micro solder ball on the corresponding fifth electrical contact pad.

16. The method of claim 13, wherein a copper post is formed on each of the third electrical contact pads, the fourth electrical contact pads, and fifth electrical contact pads fifth electrical contact pads, and a solder cap is formed on an end of each copper post further away from the corresponding electrical contact pad, each fourth electrical contact pad is electrically connected to the corresponding first electrical contact pad by the copper post and the solder cap on the corresponding fourth electrical contact pad, each third electrical contact pad is electrically connected to the corresponding first electrode pad by the copper post and the solder cap on the corresponding third electrical contact pad, and each fifth electrical contact pad is electrically connected to the corresponding second electrode pad by the copper post and the solder cap on the corresponding fifth electrical contact pad.

* * * * *